(12) United States Patent
Miyawaki et al.

(10) Patent No.: US 8,202,933 B2
(45) Date of Patent: Jun. 19, 2012

(54) SILICONE RESIN COMPOSITION FOR ENCAPSULATING LUMINESCENT ELEMENT AND PROCESS FOR PRODUCING OPTICAL-SEMICONDUCTOR ELECTRONIC PART WITH THE SAME THROUGH POTTING

(75) Inventors: Yoshiteru Miyawaki, Takatsuki (JP);
Osamu Tanaka, Takatsuki (JP)

(73) Assignee: Sanyu Rec Co., Ltd., Osaka (JP)

( * ) Notice: Subject to any disclaimer, the term of this patent is extended or adjusted under 35 U.S.C. 154(b) by 71 days.

(21) Appl. No.: 12/449,921

(22) PCT Filed: Mar. 10, 2008

(86) PCT No.: PCT/JP2008/054255
§ 371 (c)(1),
(2), (4) Date: Sep. 3, 2009

(87) PCT Pub. No.: WO2008/114634
PCT Pub. Date: Sep. 25, 2008

(65) Prior Publication Data
US 2010/0062552 A1    Mar. 11, 2010

(30) Foreign Application Priority Data
Mar. 19, 2007   (JP) ................................. 2007-070852

(51) Int. Cl.
*C08L 83/04* (2006.01)
*H01L 23/29* (2006.01)

(52) U.S. Cl. ........ 524/588; 524/492; 524/493; 525/478; 528/15; 528/31; 528/32; 257/791

(58) Field of Classification Search .................. None
See application file for complete search history.

(56) References Cited

U.S. PATENT DOCUMENTS

| | | | |
|---|---|---|---|
| 5,371,163 A | 12/1994 | Wilson | |
| 5,444,106 A | 8/1995 | Zhou et al. | |
| 5,739,199 A | 4/1998 | Eguchi et al. | |
| 6,172,134 B1 * | 1/2001 | Cooke | 523/176 |
| 6,265,480 B1 * | 7/2001 | Enami et al. | 524/588 |
| 6,425,600 B1 * | 7/2002 | Fujiki et al. | 280/728.1 |
| 6,518,204 B2 * | 2/2003 | Yamakawa et al. | 438/780 |
| 6,586,105 B2 * | 7/2003 | Eguchi et al. | 428/447 |
| 7,785,715 B2 * | 8/2010 | Tsumura et al. | 428/447 |
| 8,044,162 B2 | 10/2011 | Morita et al. | |

FOREIGN PATENT DOCUMENTS

| | | | |
|---|---|---|---|
| JP | 7294701 A | | 11/1995 |
| JP | 9-132718 A | * | 5/1997 |
| JP | 10-228249 A | | 8/1998 |
| JP | 10-242513 A | | 9/1998 |
| JP | 11-222555 A | | 8/1999 |
| JP | 2000-123981 A | | 4/2000 |
| JP | 2002-265786 A | | 9/2002 |
| JP | 2006-335857 A | | 12/2006 |
| JP | 2007-197511 A | | 8/2007 |
| JP | 2008-050494 A | | 3/2008 |
| JP | 2008222828 A | | 9/2008 |
| WO | WO-2008/047892 A1 | | 4/2008 |

OTHER PUBLICATIONS

"Handbook of Fillers, 2nd Edition" edited by Wypych and published by Chem-Tec Publishing ©2000.*
Machine-generated translation of JP 9-132718 A (May 1997).*
Supplementary European Search Report dated Jul. 7, 2010, issued for the corresponding European Patent Application No. 08721671.9.
International Search Report mailed May 27, 2008, issued on PCT/JP2008/054255.
Office Action issued in Japanese Patent Application No. JP 2007-70852, dated Aug. 2, 2011.

* cited by examiner

*Primary Examiner* — Marc Zimmer
(74) *Attorney, Agent, or Firm* — Edwards Wildman Palmer LLP; James E. Armstrong, IV; Nicholas J. DiCeglie, Jr.

(57) ABSTRACT

The present invention provides a silicone resin composition for encapsulating light-emitting elements with which encapsulation using a potting method can be easily accomplished, and which can be easily molded into a lens shape such as hemisphere, parabola, or the like. The composition can impart high transparency to the resulting encapsulating lens molded using a potting method.
More particularly, the invention provides a silicone resin composition for encapsulating light-emitting elements, including 2 to 25 wt % of silica with a mean particle size of 1 to 30 nm based on the total amount of Components (A) and (B); and having a viscosity (23° C.) of more than 10 Pa·s and less than 70 Pa·s, and a thixotropic index of 2.0 to 5.5; the composition being used for encapsulation using a potting method. The invention also provides a process for producing an optical semiconductor electronic part, including applying the composition as an encapsulating resin to a substrate with a light-emitting element, thereby molding the encapsulating resin into a lens shape by potting.

4 Claims, 5 Drawing Sheets

(a)

(b)

(c)

(a)

(b)

(c)

(a)

(b)

(c)

SILICONE RESIN COMPOSITION FOR ENCAPSULATING LUMINESCENT ELEMENT AND PROCESS FOR PRODUCING OPTICAL-SEMICONDUCTOR ELECTRONIC PART WITH THE SAME THROUGH POTTING

TECHNICAL FIELD

The present invention relates to a silicone resin composition that is particularly suitable for forming encapsulating lenses using a potting method, such as printing, vacuum printing, dispensing, or the like.

BACKGROUND ART

Inorganic glass exhibits high transparency, high heat-resistance, and dimensional stability, and therefore, has long been used in a wide range of industrial fields as a structure that passes visible light while dividing space, without impairing visibility. Despite these excellent characteristics, inorganic glass has three major drawbacks: a large specific gravity of 2.5 or more; low impact resistance, i.e., easy to break; and an unexpectedly high cost for lens processing. Particularly because of the recent progression of downsizing such as reductions in weight and thickness in various industrial fields, there is an ever increasing demand from users to overcome the above-mentioned drawbacks.

Transparent thermoplastics and thermosetting plastics are considered to be promising materials that can meet this industrial demand. Examples of transparent thermoplastics include PMMA (polymethyl methacrylate), PC (polycarbonates), and the like. Among these, PMMA is also referred to as an organic glass, and is attracting attention as a material that exhibits excellent transparency and overcomes two of the drawbacks of the glass. These transparent plastics, however, are significantly inferior to inorganic glass in heat resistance, and can only be used in limited applications.

Examples of transparent thermosetting plastics include epoxy resins, curable (meth)acrylate resins, silicone resins, and the like. These thermosetting plastics are generally more resistant to heat than the above-mentioned thermoplastics. Among the above, epoxy resins, in particular, have been generally used as materials or adhesives for encapsulating LEDs. However, with the recent attention being paid to white LEDs, yellowing and cracking of epoxy resins caused by heat or ultraviolet light have been posed as new problems. Moreover, molded articles of epoxy resins have the drawback of having low impact resistance and being brittle. On the other hand, curable (meth)acrylate resins have an excellent balance of heat resistance and moldability, excellent balance of physical properties of the molded article, etc.; however, they have the drawback of having high water absorption, which is accompanied by a large dimensional change.

Among thermosetting plastics, silicone resins exhibit excellent resistance to heat, weather, and water. Therefore, silicone resins solve the above-mentioned problems of various plastics, and are currently the most promising materials as an alternative to inorganic glass. For example, the use of silicone resins as mold members for LEDs (Patent Literatures 1 and 2), color filter materials (Patent Literature 3), and the like has been suggested. The use of these general silicone resins, however, has posed problems such as cracking due to thermal shock, complicated steps of processing the resins into a lens shape, and the like.

CITATION LIST

Patent Literature

[PTL 1] Japanese Unexamined Patent Publication No. 10-228249
[PTL 2] Japanese Unexamined Patent Publication No. 10-242513
[PTL 3] Japanese Unexamined Patent Publication No. 2000-123981

SUMMARY OF INVENTION

Technical Problem

Accordingly, it is an object of the invention to provide a silicone resin composition for encapsulating light-emitting elements with which encapsulation using a potting method can be easily accomplished, and which can be easily molded into a lens shape such as a hemisphere, parabola, or the like. The composition can also impart high transparency to the resulting encapsulating lens molded using a potting method.

Solution to Problem

The present inventors conducted extensive research in view of the above-described prior art problems. Consequently, the inventors found that the use of the composition described below facilitates the formation of a lens using a potting method, and that the resulting lens exhibits high transparency. The present invention has been accomplished based on this finding.

Specifically, the invention provides a composition for encapsulating light-emitting elements using a potting method, and a process for producing an optical semiconductor electronic part using a potting method, that have the following features.

Item 1. A silicone resin composition for encapsulating light-emitting elements comprising:

(A) a liquid or solid organopolysiloxane having at least two alkenyl groups per molecule represented by Average Compositional Formula (1):

$$R_n SiO_{(4-n)/2} \quad (1)$$

wherein each R is independently a substituted or unsubstituted monovalent hydrocarbon, alkoxy, or hydroxy group; 0.1 to 80 mol % of R which is a substituted or unsubstituted monovalent hydrocarbon comprises alkenyl groups; and n is a positive number that satisfies $1 \leq n < 2$;

(B) an organohydrogenpolysiloxane having at least two Si—H bonds per molecule represented by Average Compositional Formula (2):

$$R'_a H_b SiO_{(4-a-b)/2} \quad (2)$$

wherein each R' is independently a substituted or unsubstituted monovalent hydrocarbon excluding an aliphatic unsaturated hydrocarbon; and a and b are each positive numbers that satisfy $0.7 \leq a \leq 2.1$, $0.001 \leq b \leq 1.0$, and $0.8 \leq a+b \leq 2.6$; and/or an organohydrogensilane represented by Formula (3):

$$R'_c SiH_{(4-c)} \quad (3)$$

wherein each R' is as defined above, and c is 1 or 2; and (C) an addition reaction catalyst;

the composition further comprising (D) 2 to 25 wt % of silica with a mean particle size of 1 to 30 nm based on the total amount of Components (A) and (B); the composition having a viscosity (23° C.) of more than 10 Pa·s and less than 70 Pa·s, and having a thixotropic index of 2.0 to 5.5; and the composition being used for encapsulation using a potting method.

Item 2. The composition according to Item 1, wherein the silica has a mean particle size of 1 to 15 nm.

Item 3. A process for producing an optical semiconductor electronic part, comprising applying the composition of Item 1 or 2 as an encapsulating resin to a substrate with a light-emitting element, thereby molding the encapsulating resin into a lens shape by potting.

The invention is described in detail below.

The composition of the invention is used to encapsulate light-emitting elements by potting. The composition has a viscosity (23° C.) of more than 10 Pa·s and less than 70 Pa·s, and preferably 20 to 50 Pa·s, and has a thixotropic index of 2.0 to 5.5, and preferably 2.5 to 4.0.

In the invention, Component (A) is a principal component (a base polymer) of the composition, and is a liquid or solid organopolysiloxane resin having at least two alkenyl groups per molecule represented by Average Compositional Formula (1):

$$R_nSiO_{(4-n)/2} \tag{1}$$

wherein each R is independently a substituted or unsubstituted monovalent hydrocarbon, alkoxy, or hydroxy group; and 0.1 to 80 mol % of the entire R contains alkenyl groups; and n is a positive number that satisfies $1 \leq n < 2$.

The organopolysiloxane resin has a branched structure or a three-dimensional network structure, which is a resinoid structure essentially containing trifunctional siloxane units $RSiO_{3/2}$, wherein R is as defined above; and/or $SiO_{4/2}$ units.

In Formula (1) above, n is a positive number that satisfies $1 \leq n < 2$, preferably $1 \leq n \leq 1.8$, and more preferably $1 \leq n \leq 1.5$.

In Formula (1) above, the substituted or unsubstituted monovalent hydrocarbon represented by R bonded to the silicon atom may typically contain 1 to 12 carbon atoms, and preferably about 1 to about 8 carbon atoms. Specific examples of such substituted or unsubstituted monovalent hydrocarbons include alkyls such as methyl, ethyl, propyl, isopropyl, butyl, isobutyl, tert-butyl, pentyl, neopentyl, hexyl, cyclohexyl, octyl, nonyl, decyl, and the like; aryls such as phenyl, tolyl, xylyl, naphthyl, and the like; aralkyls such as benzyl, phenylethyl, phenylpropyl, and the like; vinyl, allyl, propenyl, isopropenyl, butenyl, hexenyl, cyclohexenyl, octenyl, and the like. Further examples include alkenyl groups such as those derived from vinyl norbornene, represented by Formula:

[Chem. 1]

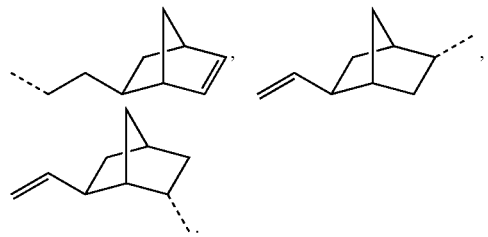

wherein each dashed line represents a bonding site; and groups wherein a portion or all of the hydrogen atoms in the above-mentioned groups are substituted by halogen atoms such as fluorine, bromine, chlorine, and the like, cyano groups, and the like. Examples of such groups include halogen-substituted alkyls such as chloromethyl, chloropropyl, bromoethyl, trifluoropropyl, and the like; cyanoethyl; and the like. Examples of alkoxy groups include lower alkoxy groups typically containing 1 to 6 carbon atoms, and preferably about 1 to about 4 carbon atoms, such as methoxy, ethoxy, propoxy, isopropoxy, butoxy, isobutoxy, tert-butoxy, and the like.

In this case, it is necessary that R contain at least two alkenyl groups preferably with 2 to 8 carbon atoms, and more preferably 2 to 6 carbon atoms. The alkenyl content in the total organic groups of R, which is preferably the above-mentioned substituted or unsubstituted monovalent hydrocarbon, excluding hydroxy and alkoxy groups, is 0.1 to 80 mol %, preferably 0.5 to 50 mol %, and particularly preferably about 1 to about 30 mol %. Typically, the total content of alkoxy and hydroxy groups in Component (A), which is an organopolysiloxane resin, is preferably 0 to 5 mass %, and particularly preferably about 0.1 to about 3 mass %.

The introduction of phenyl groups into the above-mentioned organopolysiloxanes is effective to achieve a high refractive index; particularly preferable is an organopolysiloxane with a high phenyl content represented by Average Compositional Formula (1-1):

$$R''_p(C_6H_5)_qSiO_{(4-p-q)/2} \tag{1-1}$$

wherein R" is the same as R, excluding phenyl; p and q are each positive numbers that satisfy $1 \leq p+q < 2$, preferably $1 \leq p+q \leq 1.8$, and more preferably $1 \leq p+q \leq 1.5$, and satisfy $0.20 \leq q/(p+q) \leq 0.95$, preferably $0.30 \leq q/(p+q) \leq 0.80$, and more preferably $0.30 \leq q/(p+q) \leq 0.70$.

More preferable as Component (A) is an organopolysiloxane containing 20 to 80 mol % of phenyl groups based on the total organic groups; 10 to 80 mol % of at least one $C_{2-6}$ alkenyl group based on the total organic groups; and 2 to 45 mol % of at least one $C_{1-8}$ alkyl group based on the total organic groups.

Specific examples of the types of siloxane units in organopolysiloxanes as Component A include monovinyl siloxane, monomethyl siloxane, monoethyl siloxane, monophenyl siloxane, divinyl siloxane, phenylvinyl siloxane, methylphenyl siloxane, diphenyl siloxane, dimethylsiloxane, trivinyl siloxane, divinylmethyl siloxane, divinylphenyl siloxane, vinyl dimethylsiloxane, vinyl phenylmethyl siloxane, trimethyl siloxane, dimethylphenyl siloxane, methyldiphenyl siloxane, triphenyl siloxane, and the like; and siloxanes wherein the hydrogen atoms of the organic groups in these siloxanes are substituted by halogens or the like.

The above-mentioned organopolysiloxane in a liquid or solid state is used as a base polymer. The organopolysiloxane preferably has a viscosity at 25° C. of 0.01 Pa·s or more, more preferably 0.03 to 10,000 Pa·s, and still more preferably 0.05 to 1,000 Pa·s.

In order to adjust the viscosity of the composition or the hardness of the cured product, Component (A) may optionally contain a straight-chain diorganopolysiloxane with or without phenyl groups, which contains alkenyl group(s) (e.g., vinyl group(s)) bonded to the silicon atom at an end of the molecular chain, the silicon atom along the molecular chain, or the silicon atoms at an end of and along the molecular chain. The main chain of the straight-chain diorganopolysiloxane contains repeat units consisting of diorganosiloxane, and the molecular chain of the diorganopolysiloxane is terminated with triorganosiloxy groups at both ends thereof.

Next, Component (B) which is an organohydrogenpolysiloxane and/or organohydrogensilane acts as a crosslinking agent to cure the composition by the hydrosilylation reaction with Component (A) which is an alkenyl-containing organopolysiloxane. Component (B) is an organohydrogenpolysiloxane containing at least 2, typically 2 to 200, and preferably 3 or more, and, for example, 3 to 150, SiH bonds per molecule represented by Average Compositional Formula (2):

$$R'_a H_b SiO_{(4-a-b)/2} \quad (2)$$

wherein each R' is independently a substituted or unsubstituted monovalent hydrocarbon excluding an aliphatic unsaturated hydrocarbon; and a and b are each positive numbers that satisfy $0.7 \leq a \leq 2.1$, $0.001 \leq b \leq 1.0$, and $0.8 \leq a+b \leq 2.6$, and preferably satisfy $0.8 \leq a \leq 2$, $0.01 \leq b \leq 1$, and $1 \leq a+b \leq 2.4$; and/or an organohydrogensilane represented by Formula (3):

$$R'_c SiH_{(4-c)} \quad (3)$$

wherein R' is as defined above, and c is 1 or 2.

R' may be a group similar to the unsubstituted or substituted monovalent hydrocarbon represented by R in Formula (1), which preferably does not have an aliphatic unsaturated bond.

Examples of the above-mentioned organohydrogensilane and organohydrogenpolysiloxane include phenyl methyl hydrogen polysiloxane; $(CH_3)SiH_3$; $(CH_3)_2SiH_2$; $(C_6H_5)SiH_3$; 1,1,3,3-tetramethyldisiloxane; 1,3,5,7-tetramethylcyclotetrasiloxane; methyl hydrogen polysiloxane terminated with trimethylsiloxy groups at both ends; dimethyl siloxane/methyl hydrogen siloxane copolymer terminated with trimethylsiloxy groups at both ends; dimethylpolysiloxane terminated with dimethylhydrogensiloxy groups at both ends; dimethylsiloxane/methylhydrogensiloxane copolymer terminated with dimethylhydrogensiloxy groups at both ends; methylhydrogensiloxane/diphenylsiloxane copolymer terminated with trimethylsiloxy groups at both ends; methylhydrogensiloxane/diphenylsiloxane/dimethylsiloxane copolymer terminated with trimethylsiloxy groups at both ends; a copolymer of $(CH_3)_2HSiO_{1/2}$ and $SiO_{4/2}$ units; a copolymer of $(CH_3)_2HSiO_{1/2}$, $SiO_{4/2}$, and $(C_6H_5)SiO_{3/2}$ units; and the like. Preferable is phenyl methyl hydrogen polysiloxane.

Component (B) which is an organohydrogenpolysiloxane may have a straight, ring, branched, or three-dimensional network structure. The number of silicon atoms per molecule (or the degree of polymerization) is 3 to 1,000, and particularly about 3 to about 300.

Component (B) has a viscosity at 25° C. of preferably 1,000 mPa·s, or less, more preferably 0.1 to 500 mPa·s, and still more preferably 0.5 to 300 mPa·s.

When the organopolysiloxane as Component (A) has phenyl groups, Component (B) which is an organohydrogensilane and/or an organohydrogenpolysiloxane also preferably has phenyl groups, to provide transparency and prevent separation during storage. In this case, R' in Formula (2) has a phenyl content of preferably 5 mol % or more, more preferably 8 to 50 mol %, and still more preferably 10 to 30 mol %, of the total groups bonded to the silicon atom (i.e., the hydrogen atom and R' bonded to the silicon atom).

The amount of Component (B), which is an organohydrogenpolysiloxane and/or an organohydrogensilane, is 1 to 100 parts by mass, and preferably 2 to 50 parts by mass, based on 100 parts by mass of Component (A), which is an organopolysiloxane. When the amount of Component (B) is within these ranges, workability will be excellent, and crosslinking will be sufficient to yield a cured product with an excellent hardness.

Moreover, the organohydrogenpolysiloxane and/or organohydrogensilane may be used in an amount such that the molar ratio of the alkenyl groups bonded to the silicon atom in Component (A), which is an organopolysiloxane, or the total alkenyl groups bonded to the silicon atoms in the organopolysiloxane and the above-mentioned optional straight-chain diorganopolysiloxane containing alkenyl group(s), relative to the hydrogen atoms bonded to the silicon atom (i.e., Si/H groups) in Component (B), is 0.5 to 5 mol/mol, preferably 0.8 to 4 mol/mol, and more preferably 1 to 3 mol/mol.

Component (C), which is an addition reaction catalyst, is a catalyst for promoting the hydrosilylation addition reaction between the alkenyl groups in Component (A) and the Si—H groups in Component (B). Examples of the addition reaction catalyst include platinum-based catalysts such as platinum black, platinum (IV) chloride, chloroplatinic acid, a reaction product of chloroplatinic acid and a monohydric alcohol, a complex of chloroplatinic acid and an olefin, platinum bis (acetoacetate), and the like; platinum-group metal catalysts such as palladium- and rhodium-based catalysts; and the like. Preferable among these is a platinum-based compound that is readily industrially available and can achieve the intended purpose by adding it in only a small amount.

The addition reaction catalyst is used in a catalytic amount. Typically, the amount of the catalyst calculated as the platinum-group metal is 0.1 to 1,000 ppm, preferably 1 to 500 ppm, and more preferably about 2 to about 100 ppm, based on the total amount by weight of Components (A) and (B).

Component (D) is silica. The addition of fine silica with a mean particle size of 1 to 30 nm to Components (A) to (C) makes the viscosity of the composition suitable for molding a lens shape using a potting method, and makes the refractive index of the cured product close to that of the silica, thereby achieving high transparency. Preferably, the mean particle size of the silica is 1 to 15 nm.

The silica may be precipitated silica, silica xerogel, fumed silica, fused silica, crystal silica, or silica obtained by subjecting these types of silica to a hydrophobing treatment using a silane compound. Preferable is silica subjected to a hydrophobing treatment using a silane compound, and more preferable is fumed silica subjected to a hydrophobing treatment using a silane compound. Examples of silane compounds used in the hydrophobing treatment include monomethyltrichlorosilane, dimethyldichlorosilane, hexamethyldisilazane, octylsilane, and the like. These types of silica are commercially available; for example, "Aerosil" from Nippon Aerosil can be mentioned.

The amount of the silica used is 5 to 25 wt %, and more preferably 7 to 15 wt %, based on the total amount of Components (A) and (B). When the amount of silica is within these ranges, good dispersibility of the silicone resin and silica will be achieved to thereby suppress the fluidity of the silicone resin. Thus, when the composition is applied to a substrate, and a mask is subsequently separated from the substrate, a nearly hemispherical lens can be formed, and the lens shape can be retained as is. It is noted that since silica is a white powder, the resulting encapsulating lens may have a slightly milky white color, depending on the type of the silicone resin used. The phrase "slightly milky white" used in the Examples means that the resulting lens has a slightly milky white color. When transparency is of interest, it is desirable to use a silicone resin having a refractive index equal to or close to that of the silica upon curing the resin.

In the composition of the invention, the refractive index of silica (D) is preferably equal to or close to that of the resin component upon curing, because the transparency of the encapsulating lens formed by potting will be significantly improved. The refractive index of the resin component can be measured using, for example, an Abbe refractometer, but may also be measured by other methods. Moreover, the refractive index of the resin can be adjusted depending on the selection of R in Component (A) and R' in Component (B), but can also be adjusted by other methods. For example, when methyl, alkenyl, and phenyl groups are used as R and R', the proportion of the methyl groups may be increased to lower the refractive index, and the proportion of phenyl groups may be increased to increase the refractive index. In this way, by adjusting Components (A) and (B), measuring the refractive indices of the cured products of Components (A) and (B), and selecting Components (A) and (B) having refractive indices as close to that of silica (D) as possible, the refractive index of the cured product of the composition containing these components becomes equal to or close to the refractive index of the silica (D), thereby imparting high transparency to the encapsulating lens formed. In the invention, the refractive indices of Components (A) and (B), as well as the refractive index of the cured product of the composition, are preferably ±0 to ±0.1, and more preferably ±0 to ±0.05, of the refractive index of silica (D), as measured using an Abbe refractometer (25° C.).

In addition to Components (A) to (D), the composition of the invention may optionally contain an addition reaction control agent for imparting curing properties and a longer pot life. The composition may also optionally contain straight-chain non-reactive organopolysiloxanes, straight-chain or cyclic low-molecular-weight organopolysiloxanes with about 2 to about 10 silicon atoms, and the like, for controlling the hardness and viscosity, in addition to the above-mentioned straight-chain diorganopolysiloxane with or without phenyl groups that contains alkenyl group(s), such as dimethylpolysiloxane and the like. These components may be used within ranges such that the effects of the invention are not impaired. Further, the composition may contain a wavelength adjuster, a dye, a pigment, a flame retardant, a heat-resistance imparting agent, an antioxidant, and the like, as required, within ranges such that the transparency is not affected.

The curing conditions for the composition of the invention are not limited, but the composition is preferably cured at 120 to 180° C. for 30 to 180 minutes.

The composition of the invention is a raw material of lenses for encapsulating light-emitting elements. Typical examples of light-emitting elements are those formed using compound semiconductor materials such as InGaN, SiC, AlGaInP, GaP, GaAlAs, InGaAs, GaAs, and the like, and used for light-emitting diodes (LEDs). Light emitted by the light-emitting elements is visible light, near-ultraviolet light, or near-infra-red light having a wavelength in the range of 300 to 1,200 nm. Light-emitting diodes (LEDs) are typically the optical semiconductor electronic parts to be formed using the composition of the invention; however, the composition of the invention is also applicable to other electronic parts formed into a lens shape, such as photodiodes (PDs), photocouplers, vertical cavity surface emitting lasers (VCSELs), laser diodes (LDs), and the like.

Next, the process of the invention for producing an optical semiconductor electronic part includes applying the above-described composition of the invention as an encapsulating resin to a substrate with a light-emitting element, thereby molding the encapsulating resin into a lens shape by potting. Potting can be performed using a dispensing method, a printing method, or the like.

Screen printing using a vacuum-printing apparatus is described as one embodiment of the process of the invention. First, light-emitting elements (not shown) are mounted on predetermined positions of a substrate 1, and the substrate 1 is placed on a raising and lowering table 3 that is located in a lower chamber 2. An upper chamber 4 includes a mask 6 with openings 5, and two squeegees 7, 8. An encapsulating resin 9 is placed on the mask 6 (FIG. 1a). Preferably, the mask has a thickness of 0.1 to 5.0 mm and an opening diameter of 0.5 to 15 mm.

The table 3 is subsequently raised, allowing the mask 6 and the substrate 1 to contact each other such that the light-emitting elements are positioned within the openings 5 (FIG. 1b). While the substrate 1 is raised in this description, the mask 6 may be lowered, or both of the mask 6 and the substrate 1 may be moved to contact each other.

The apparatus is next placed under vacuum conditions as required, and the right squeegee 7 is lowered to transfer the encapsulating resin 9, filling the openings 5 in the mask 6 (FIG. 1c) with the encapsulating resin 9. The composition 9 of the invention may also be placed on the mask 6 after the mask 6 and the substrate 1 contact each other.

The left squeegee 8 is subsequently lowered to remove the encapsulating resin 9 from the mask 6 (FIG. 2a).

Next, the table 3 is slowly lowered to gradually separate the substrate 1 from the mask 6 (FIGS. 2b and 2c), which causes the shape of the encapsulating resin 9 on the substrate 1 to gradually change into a lens shape, as shown in FIG. 3a. While the substrate 1 is moved to separate the mask 6 and substrate 1 in this description, the mask 6 may be moved, or both of the mask 6 and the substrate 1 may be moved to separate them. When the substrate 1 and mask 6 are separated at a speed of 0.01 to 1.0 mm/s, the encapsulating resin 9 becomes more neatly hemispherical.

The lower chamber 2 is then moved, and the substrate 1 having thereon the encapsulating resin 1 formed in a lens shape is subjected to a resin-curing step (FIGS. 3b and 3c). The substrate 1 is heated to cure the lens-shaped composition, resulting in the substrate 1 on which the light-emitting elements are encapsulated with the lens-shaped transparent resin 10. The heating and curing are performed, for example, at 120 to 180° C. for 30 to 180 minutes.

When encapsulating lenses are formed using a dispensing method, a substrate on which light-emitting elements are encapsulated with a lens-shaped transparent resin is obtained as with the above-described screen printing, i.e., as follows: a substrate having light-emitting elements and a mask are contacted; openings in the mask are filled with a predetermined amount of encapsulating resin using a dispenser; the mask and the substrate are separated, as with the above-described screen printing, to form the encapsulating resin into a lens shape; and the substrate with the lens-shaped resin is subsequently subjected to a resin-curing step.

Advantageous Effects of Invention

In accordance with the invention, highly transparent lenses for encapsulating light-emitting elements can be easily produced using a potting method.

EXPLANATION OF REFERENCE NUMERALS

Figure 1:
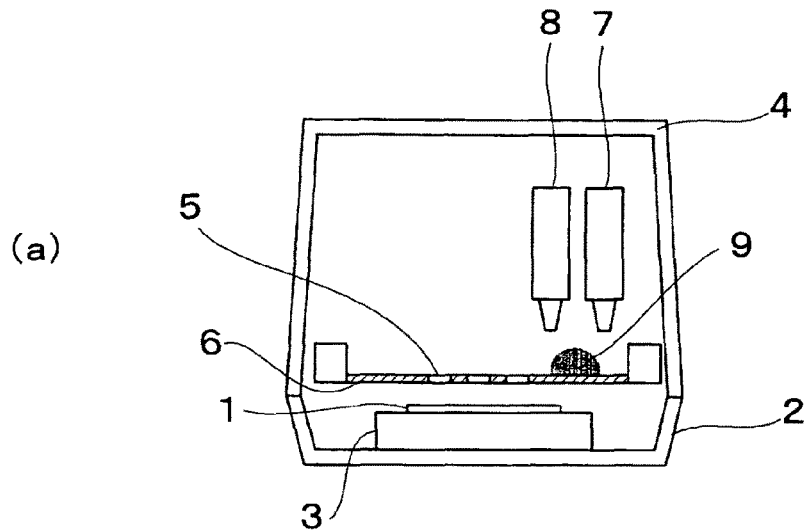
FIG. 1 shows one step of the vacuum-printing method, which is one embodiment of the process of the invention.
Figure 1:
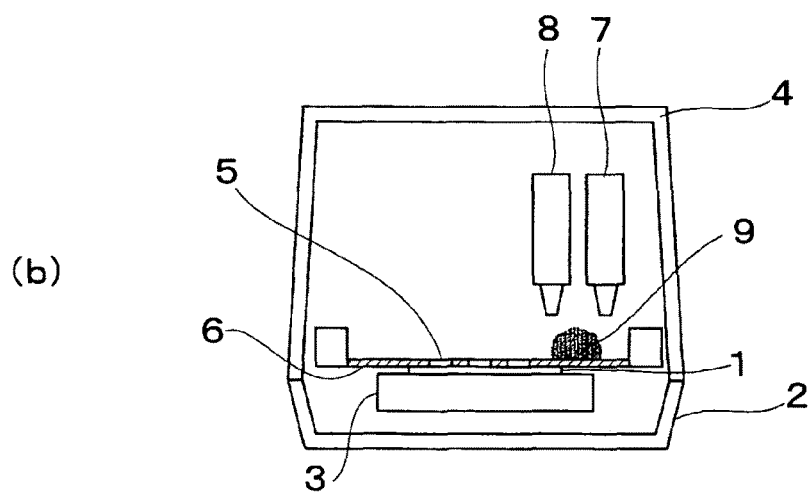
Figure 1:
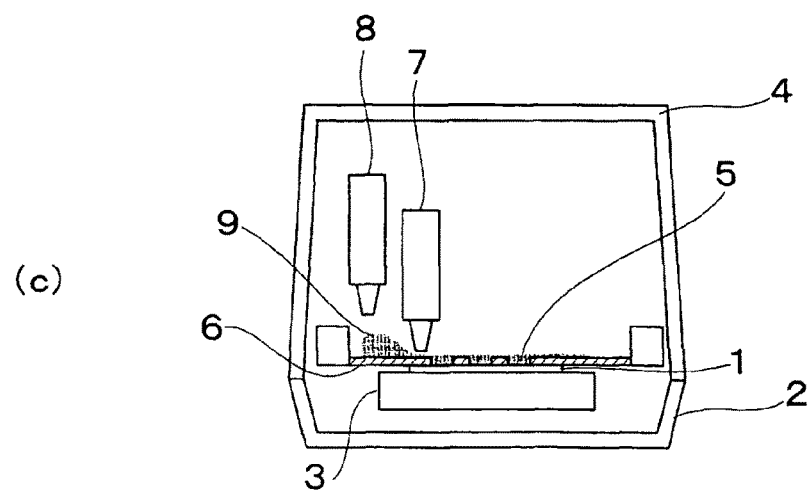
Figure 2:
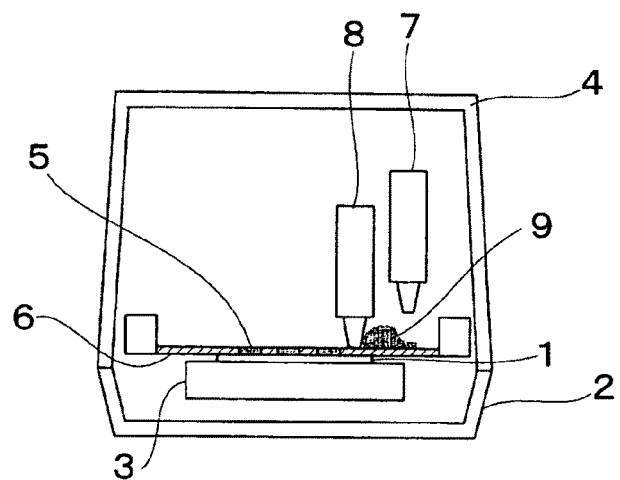
FIG. 2 shows one step of the vacuum-printing method, which is one embodiment of the process of the invention.
Figure 2:
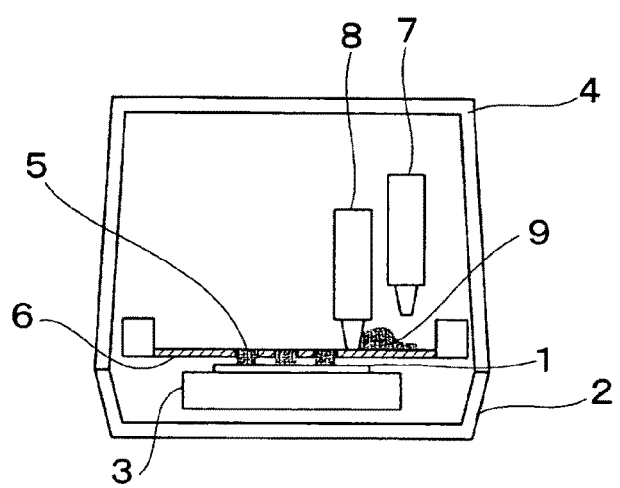
Figure 2:
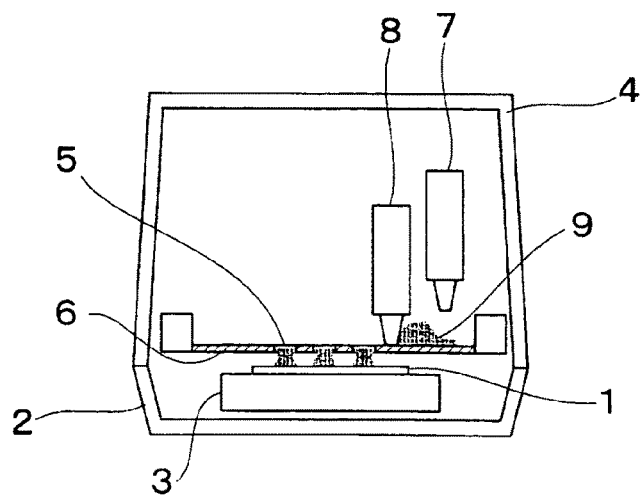
Figure 3:
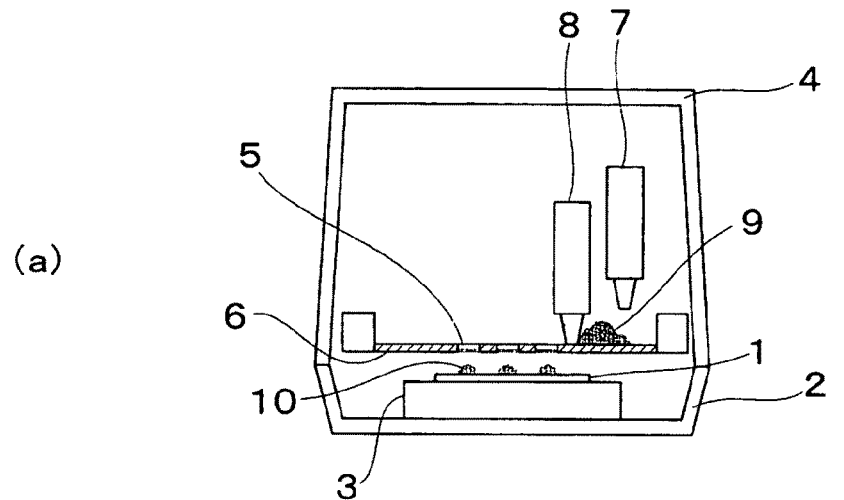
FIG. 3 shows one step of the vacuum-printing method, which is one embodiment of the process of the invention.
Figure 3:
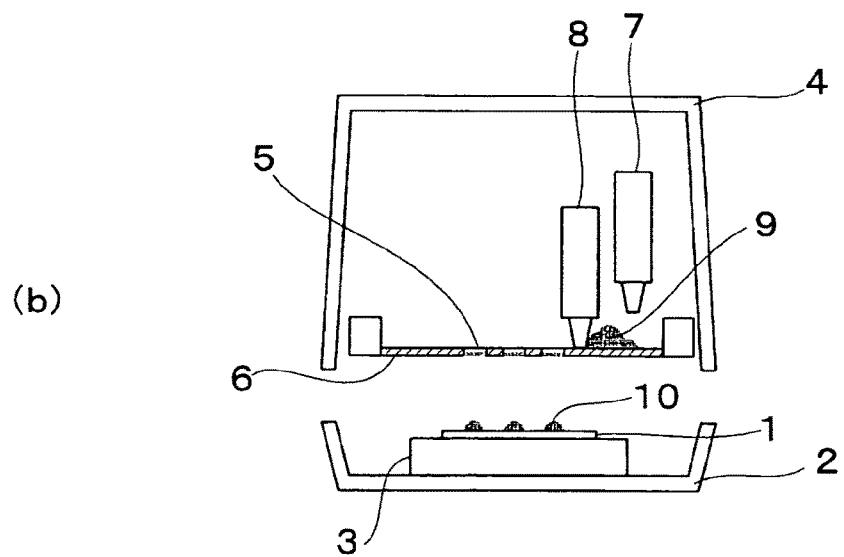
Figure 3:
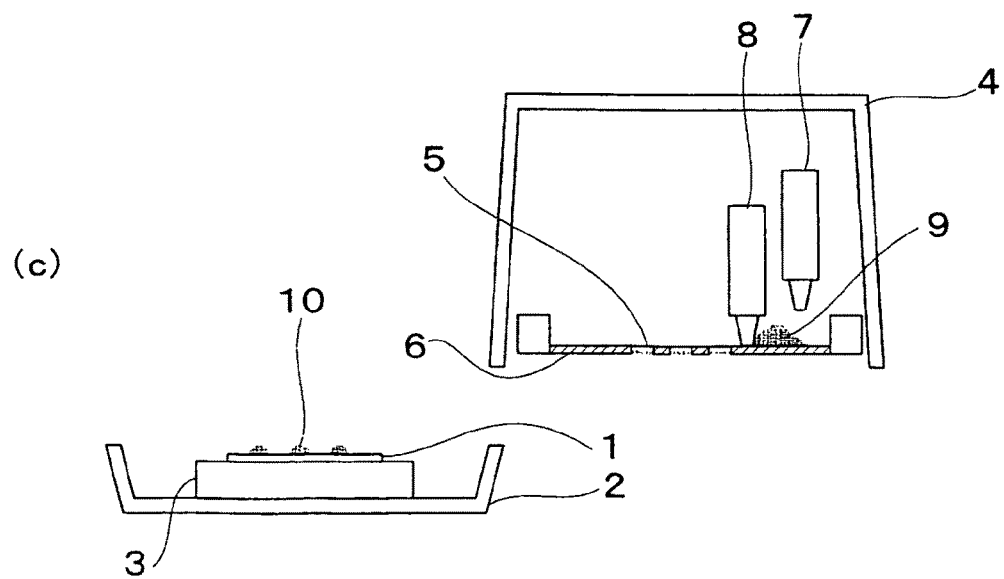

1: Substrate
2: Lower Chamber
3: Table
4: Upper Chamber
5: Opening
6: Mask
7: Right Squeegee
8: Left Squeegee
9: Encapsulating Resin
10: Encapsulating Lens

DESCRIPTION OF EMBODIMENTS

The invention is described below with reference to Examples and the like; however, the invention is not limited to these examples.

In the Examples, Comparative Examples, and Test Example shown below, measurements were conducted as follows.

Viscosity and Thixotropic Index Measurement

A sample was placed in a glass vial, and allowed to stand for about 1 hour in a water bath at 23° C. Viscosities at 2 and 20 rpm were subsequently measured using a B-type rotational viscometer.

The thixotropic index was determined as the ratio of the viscosity at 2 rpm and the viscosity at 20 rpm, and expressed as a number.

Refractive Index

The refractive index of the resin composition in a liquid state was measured using an Abbe refractometer at 25° C.

Transmittance Measurement

A 1 mm thick sample piece was prepared, and transmittance was measured at wavelengths of 650, 575, and 450 nm, using a spectrophotometer. Further, transmittance was similarly measured for the sample piece after the thermal discoloration test described below.

Thermal Discoloration Test

The sample piece used in the transmittance measurement was placed in an oven dryer at 150° C., and the degree of discoloration of the sample piece after 3,000 hours was visually examined.

Example 1

A silicone resin "KE-106" from Shin-Etsu Chemical Co., Ltd., which contains (A) an organopolysiloxane, (B) an organohydrogenpolysiloxane, and (C) an addition reaction catalyst, was blended with fine silica "RY-200" having a mean particle size of about 12 nm from Nippon Aerosil, which is silica coated with a dimethyl silicone oil, in an amount of 10 wt % silica based on the silicone resin. The resulting composition was subjected to viscosity, thixotropic index, refractive index, and transmittance measurements, as well as a thermal discoloration test. The results are shown in Table 1.

Example 2

Toluene, phenyltrichlorosilane, vinyl methyl dichlorosilane, and dimethyldichlorosilane were charged into a reactor, and cohydrolyzed and polymerized to prepare a 50 wt % toluene solution of an organopolysiloxane copolymer (a silicone resin), i.e., a resin melt, containing $(C_6H_5)SiO_{3/2}$ units, $(CH_2=CH)(CH_3)SiO_{2/2}$ units, and $(CH_3)_2SiO_{2/2}$ units, and represented by the average composition $(CH_3)_{0.8}(C_6H_5)_{0.4}(CH_2=CH)_{0.1}SiO_{1.35}$. Phenylmethyl hydrogen siloxane having a viscosity of 10 mPa·s, which contains 15 mol % of phenyl groups based on the total content of methyl groups, phenyl groups, and hydrogen atoms bonded to the silicon atoms (SiH groups) and produces 150 ml/g hydrogen gas, was added in an amount of 10 wt parts to 100 parts of the previously obtained resin melt and mixed; stripping was subsequently conducted under reduced pressure until elution was completed at 150° C. After the product was cooled to room temperature, 0.2 wt parts of ethylcyclohexanol was added as a reaction control agent. To this mixture was added a platinum catalyst in an amount of 20 ppm when calculated as platinum atoms. This yielded a product having a refractive index close to that of the fine silica (refractive index: 1.46); further, the fine silica used in Example 1 was added in an amount of 10 wt % based on the silicone resin. The resulting composition was subjected to viscosity, thixotropic index, refractive index, and transmittance measurements, as well as a thermal discoloration test. The results are shown in Table 1.

Comparative Example 1

A composition was prepared as in Example 1, except that fine silica was not added. The resulting composition was subjected to viscosity, thixotropic index, refractive index, and transmittance measurements, as well as a thermal discoloration test: The results are shown in Table 1.

Comparative Example 2

A composition was prepared as in Example 1, except that the amount of fine silica was changed to 30 wt %. The resulting composition was subjected to viscosity, thixotropic index, refractive index, and transmittance measurements, as well as a thermal discoloration test. The results are shown in Table 1.

Production of Lenses

Figure 4:
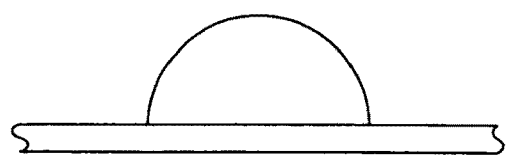
FIG. 4 shows the shape of a lens formed using each of the compositions of Examples 1 and 2.
Figure 5:
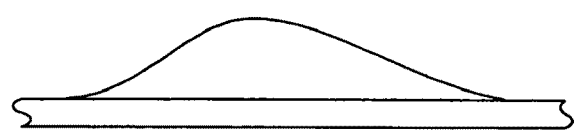
FIG. 5 shows the shape of a lens formed using the composition of Comparative Example 1.
Figure 6:
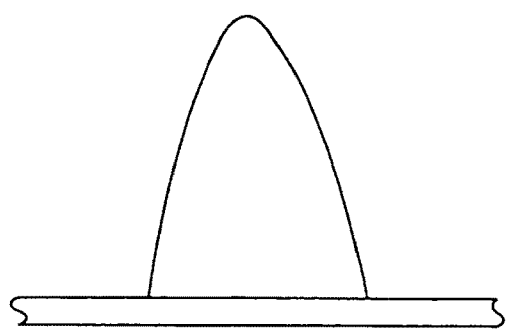
FIG. 6 shows the shape of a lens formed using the composition of Comparative Example 2.
Figure 7:
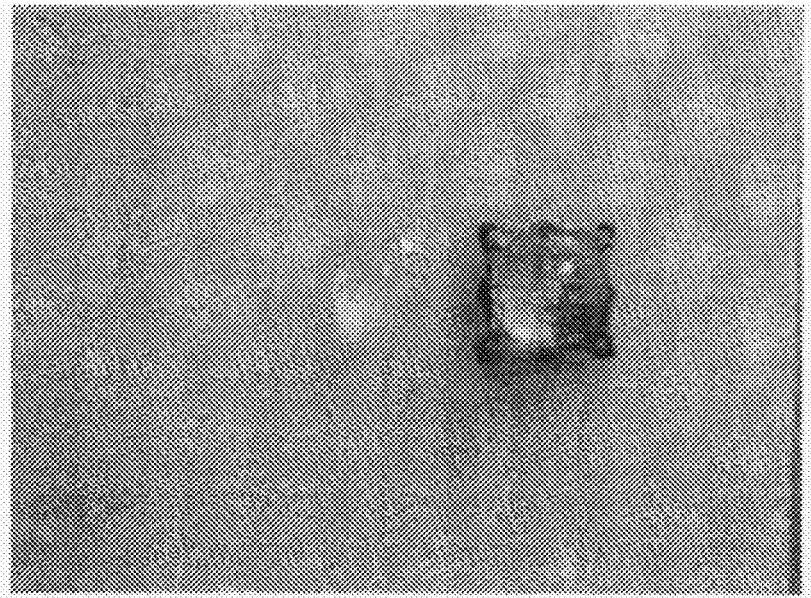
FIG. 7 shows photographs of the appearances of lenses formed using the composition of Example 2; the upper photograph shows a top view, and the lower photograph shows a side view; in each photograph, the left lens is a lens formed on a glass epoxy substrate, and the right lens is a lens formed on a printed wiring substrate.
Figure 7:
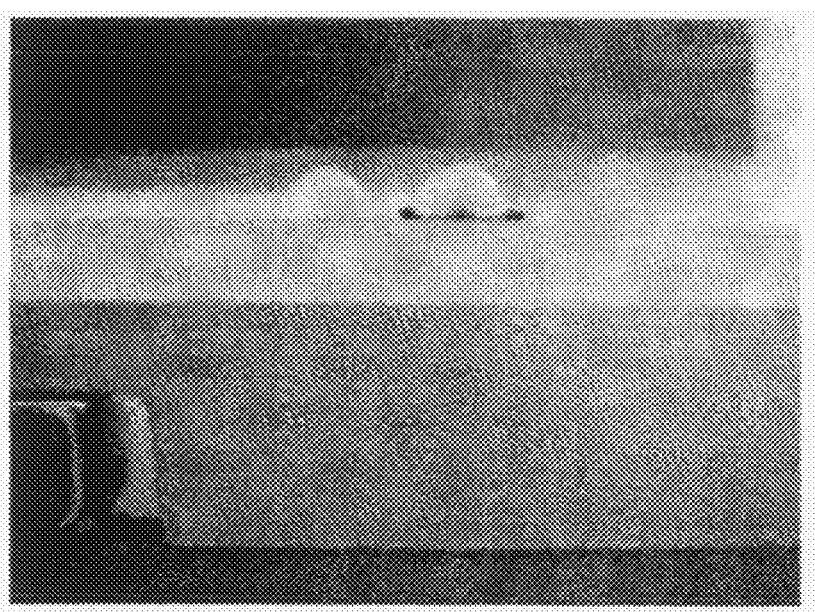

The compositions obtained in Example 1, Example 2, Comparative Example 1, and Comparative Example 2 were applied to a glass epoxy substrate with LEDs using a vacuum-printing apparatus to conduct potting. Printing was conducted as follows: first, the apparatus was vacuumed to a degree of vacuum of 0.1 Torr, and the resin was applied to fill the openings using a squeegee; the vacuum was subsequently increased to 20 Torr, and the resin was scraped off using a return squeegee. The substrate was then slowly removed from the mask in vacuum, and exposed to air, so that the composition was transferred onto the substrate. After this, the substrate was placed in an oven dryer at 150° C. for 1 hour to cure the transferred resin, and the shape and external color of the cured composition were confirmed. The results are shown in FIGS. 4 to 6. The diameter and height of the lens were also measured; the results are shown in Table 1. The mask used had an opening diameter of 3.0 mm and a thickness of 1.0 mm. Further, a printed wiring substrate was used instead of the glass epoxy substrate, and a lens was formed as described above, using the composition of Example 2. FIG. 7 shows photographs of the appearances of the lenses formed on the glass epoxy substrate and the printed wiring substrate. In FIG. 7, the upper photograph shows a top view, and the lower photograph shows a side view; in each photograph, the left lens is the lens formed on the glass epoxy substrate, and the right lens is the lens formed on the printed wiring substrate.

TABLE 1

| | Sample | | | |
|---|---|---|---|---|
| | Ex. 1 | Ex. 2 | Comp. Ex. 1 | Comp. Ex. 2 |
| Viscosity (Pa·s) | 35 | 40 | 1.5 | 67 |
| Thixotropic Index | 3.5 | 3.6 | 1.0 | 5.3 |
| Lens Diameter (mm) | 1.15 | 1.16 | 0.2 | 1.82 |
| Lens Height (mm) | 3.65 | 3.62 | 5.26 | 3.45 |
| Appearance Color | Slightly Milky White | Colorless and Transparent | Colorless and Transparent | Slightly Milky White |
| Silica Refractive Index | 1.42 | 1.46 | 1.42 | 1.42 |
| Appearance | Nearly Hemispherical (FIG. 4) | Nearly Hemispherical (FIG. 4) | Flowing Shape (FIG. 5) | Conical Shape (FIG. 6) |
| Transmittance (650 nm) | 90% | 92% | 97% | 90% |
| Transmittance (575 nm) | 78% | 86% | 95% | 72% |
| Transmittance (450 nm) | 63% | 80% | 95% | 53% |
| Thermal Discoloration (150° C./3,000 hr) | No Discoloration | No Discoloration | No Discoloration | No Discoloration |
| Transmittance (650 nm) | 85% | 90% | 95% | 87% |
| Transmittance (575 nm) | 74% | 86% | 93% | 68% |
| Transmittance (450 nm) | 60% | 78% | 90% | 50% |

In Example 1, a nearly hemispherical lens was formed. Moreover, when the refractive index was adjusted to be close to that of the fine silica, as in Example 2, the transmittance in a low-wavelength range was improved, resulting in the production of an ideal lens (FIG. 7). When fine silica was not used, or used in an excess amount, as in the Comparative Examples, the lens became out of shape, and the transmittance also deteriorated.

INDUSTRIAL APPLICABILITY

The present invention is applicable in the field of light-emitting element encapsulation.

The invention claimed is:

1. A silicone resin composition for encapsulating light-emitting elements consisting essentially of:

(A) a liquid or solid organopolysiloxane having at least two alkenyl groups per molecule represented by Average Compositional Formula (1):

$$R_n SiO_{(4-n)/2} \quad (1)$$

wherein each R is independently a substituted or unsubstituted monovalent hydrocarbon, alkoxy, or hydroxy group; 0.1 to 80 mol % of R which is a substituted or unsubstituted monovalent hydrocarbon comprises alkenyl groups; and n is a positive number that satisfies $1 \leq n < 2$;

(B) an organohydrogenpolysiloxane having at least two Si—H bonds per molecule represented by Average Compositional Formula (2):

$$R'_a H_b SiO_{(4-a-b)/2} \quad (2)$$

wherein each R' is independently a substituted or unsubstituted monovalent hydrocarbon excluding an aliphatic unsaturated hydrocarbon; and a and b are each positive numbers that satisfy $0.7 \leq a \leq 2.1$, $0.001 \leq b \leq 1.0$, and $0.8 \leq a+b \leq 2.6$; and/or an organohydrogensilane represented by Formula (3):

$$R'_c SiH_{(4-c)} \quad (3)$$

wherein each R' is as defined above, and c is 1 or 2; and (C) an addition reaction catalyst;

the composition further comprising (D) 2 to 25 wt % of silica with a mean particle size of 1 to 30 nm based on the total amount of Components (A) and (B); the composition having a viscosity (23° C.) of more than 10 Pa·s and less than 70 Pa·s, and having a thixotropic index of 2.0 to 5.5; and the composition being used for encapsulation using a potting method.

2. The composition according to claim 1, wherein the silica has a mean particle size of 1 to 15 nm.

3. A process for producing an optical semiconductor electronic part, comprising applying the composition of claim 1 as an encapsulating resin to a substrate with a light-emitting element, thereby molding the encapsulating resin into a lens shape by potting.

4. A process for producing an optical semiconductor electronic part, comprising applying the composition of claim 2 as an encapsulating resin to a substrate with a light-emitting element, thereby molding the encapsulating resin into a lens shape by potting.

* * * * *